(12) United States Patent
Malladi

(10) Patent No.: US 10,326,018 B1
(45) Date of Patent: Jun. 18, 2019

(54) RF SWITCHES, INTEGRATED CIRCUITS, AND DEVICES WITH MULTI-GATE FIELD EFFECT TRANSISTORS AND VOLTAGE LEVELING CIRCUITS, AND METHODS OF THEIR FABRICATION

(71) Applicant: NXP USA, Inc., Austin, TX (US)

(72) Inventor: Venkata Naga Koushik Malladi, Tempe, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/908,009

(22) Filed: Feb. 28, 2018

Related U.S. Application Data

(63) Continuation of application No. 15/907,740, filed on Feb. 28, 2018.

(51) Int. Cl.
| | | |
|---|---|---|
| *H01L 29/78* | (2006.01) |
| *H04B 1/48* | (2006.01) |
| *H01L 27/07* | (2006.01) |
| *H01L 29/66* | (2006.01) |

(52) U.S. Cl.
CPC ...... *H01L 29/7831* (2013.01); *H01L 27/0733* (2013.01); *H01L 29/66795* (2013.01); *H04B 1/48* (2013.01)

(58) Field of Classification Search
CPC ... H01L 27/085; H01L 21/82; H01L 27/0207; H01L 27/0211; H01L 21/8234; H01L 23/66; H01L 27/0629; H01L 28/20; H01L 28/60; H01L 29/66484; H01L 29/7831; H01L 2223/6627; H03K 17/6871; H03K 17/223; H04B 1/44
See application file for complete search history.

(56) References Cited

U.S. PATENT DOCUMENTS

| | | | |
|---|---|---|---|
| 7,504,677 B2 | 3/2009 | Glass et al. | |
| 8,723,260 B1 * | 5/2014 | Carroll | H01L 21/84 257/347 |
| 9,780,090 B2 * | 10/2017 | Fraser | H01L 27/085 |
| 2005/0263799 A1 * | 12/2005 | Nakatsuka | H01L 27/088 257/266 |
| 2006/0214238 A1 * | 9/2006 | Glass | H01L 23/4824 257/401 |
| 2006/0217078 A1 * | 9/2006 | Glass | H03G 1/0088 455/78 |
| 2006/0261912 A1 * | 11/2006 | Miyagi | H03K 17/6871 333/103 |
| 2008/0317154 A1 * | 12/2008 | Nakajima | H03K 17/005 375/267 |
| 2012/0112832 A1 * | 5/2012 | Kawano | H03F 3/72 330/124 D |

* cited by examiner

*Primary Examiner* — Shahed Ahmed
(74) *Attorney, Agent, or Firm* — Sherry W. Schumm

(57) ABSTRACT

Embodiments of field effect transistor (FET) circuits, RF switches, and devices include source and drain terminals coupled to an active surface of a semiconductor substrate, a channel in the substrate between the source and drain terminals, and a plurality of gate structures coupled to the active surface over the channel. A channel contact is coupled to the active surface over the channel between a pair of the gate structures. A first capacitor is electrically coupled between the channel contact and the source terminal, and a second capacitor is electrically coupled between the channel contact and the drain terminal.

20 Claims, 8 Drawing Sheets

RF SWITCHES, INTEGRATED CIRCUITS, AND DEVICES WITH MULTI-GATE FIELD EFFECT TRANSISTORS AND VOLTAGE LEVELING CIRCUITS, AND METHODS OF THEIR FABRICATION

RELATED APPLICATION

This application is a continuation of co-pending U.S. patent application Ser. No. 15/907,740, titled "RF Switches, Integrated Circuits, and Devices with Multi-Gate Field Effect Transistors and Voltage Leveling Circuits, and Methods of Their Fabrication", and filed on Feb. 28, 2018.

TECHNICAL FIELD

Embodiments of the subject matter described herein relate generally to multi-gate transistors, RF switches, integrated circuits, and devices that include multi-gate transistors, and methods for fabricating such transistors, RF switches, integrated circuits, and devices.

BACKGROUND

Microwave field effect transistors (FETs) are used extensively in various types of radio frequency (RF) circuits, such as power amplifiers, RF switches, and other circuits. In some RF circuits and devices, a "multi-gate" FET may be a more desirable option than a more conventional single-gate FET. Essentially, a multi-gate FET is a monolithic transistor device that includes a variable-conductivity channel between drain and source terminals, along with multiple gates positioned over the channel. Electrical signals provided to the multiple gates control the conductivity of the channel during operation of the FET. Implementation of multiple gates may enable better electrical control over the channel, when compared with single-gate FETs. This, in turn, may enable more effective suppression of "off-state" leakage current, and/or enhanced current in the "on" state (i.e., drive current).

A switch composed of a stack of multi-gate FETs (i.e., a series-coupled arrangement of several multi-gate FETs) may be implemented, in some systems, to achieve higher power handling capability. In such a switch, non-uniform, RF, alternating current (AC) voltage distribution across the stacked multi-gate FETs in an off-state may result in premature breakdown of the first multi-gate FET(s) in the stack, which in turn may degrade the power handling capability of the switch.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Embodiments of the inventive subject matter include methods and apparatuses that may achieve more uniform alternating current (AC), high frequency (e.g., radio frequency) voltage distribution across a stack of multi-gate field effect transistors (FETs) in an off-state, when compared with conventional multi-gate FET stack structures. More particularly, embodiments of the inventive subject matter include circuits and structures that are configured to ensure that the first FET(s) in a stack of multi-gate FETs do not encounter significantly higher voltages than the remaining FET(s) in the stack when the FET stack is in the off-state. Accordingly, implementation of the various embodiments may avoid significantly premature breakdown of the first FET(s), and thus may result in higher power-handling capability for the multi-gate FET stack.

Before describing multi-gate FET embodiments in detail, examples of a system, a module, and circuits in which such a multi-gate FET embodiment may be implemented are described in conjunction with FIGS. 1-4. It is to be understood that the later-described multi-gate FET embodiments may be implemented in a wide variety of other systems, modules, and circuits. Therefore, the example system, module, and circuits illustrated in FIGS. 1-4 are not to be construed as limiting the scope of the inventive subject matter.

Figure 1:
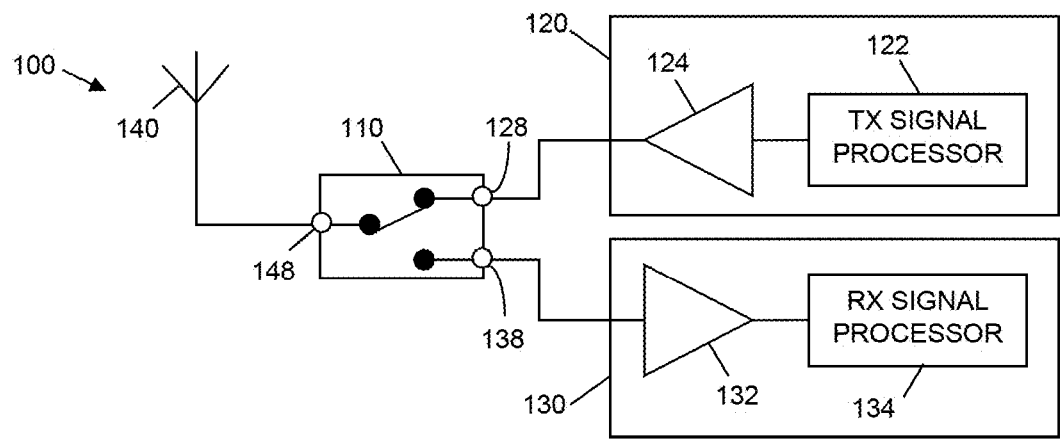
FIG. 1 is a simplified block diagram of a radio frequency (RF) transceiver system.

FIG. 1 is a simplified block diagram of an example of a radio frequency (RF) transceiver system 100 that includes an RF switch 110, a transmitter 120, a receiver 130, and an antenna 140. Transceiver system 100 is a half-duplex transceiver, in which only one of the transmitter 120 or the receiver 130 are coupled, through the RF switch 110, to the antenna 140 at any given time. More specifically, the state of the RF switch 110 is controlled (e.g., by RF switch controller IC 250, FIG. 2) to alternate between coupling an RF transmit signal produced by the transmitter 120 to the antenna 140, or coupling an RF receive signal received by the antenna 140 to the receiver 130.

The transmitter 120 may include, for example, a transmit (TX) signal processor 122 and a power amplifier 124. The transmit signal processor 122 is configured to produce transmit signals, and to provide the transmit signals to the power amplifier 124. The power amplifier 124 amplifies the transmit signals, and provides the amplified transmit signals to the RF switch 110. The receiver 130 may include, for example, a receive amplifier 132 (e.g., a low noise amplifier) and a receive (RX) signal processor 134. The receive amplifier 132 is configured to amplify relatively low power received signals from the RF switch 110, and to provide the amplified received signals to the receive signal processor 134. The receive signal processor 134 is configured to consume or process the receive signals.

During each transmit time interval, the RF switch 110 is controlled to be in a first or "transmit" state, as depicted in FIG. 1, in which a transmit signal path is closed between transmitter node 128 and antenna node 148, and in which a receive signal path is open between antenna node 148 and receiver node 138. Conversely, during each receive time interval, the RF switch 110 is controlled to be in a second or "receive" state, in which the receive signal path is closed between antenna node 148 and receiver node 138, and in which the transmit signal path is open between transmitter node 128 and antenna node 148.

The RF transceiver system 100 may be physically implemented using a variety of active and passive electrical devices, which may be housed on one or more printed circuit boards (PCBs) and/or other substrates. To facilitate assembly of such a system, various components of the RF transceiver system 100 may be implemented in self-contained modules or electrical devices, which may be coupled to a PCB that electrically connects the module/devices to other portions of the RF transceiver system 100. As used herein, the term "module" means a set of active and/or passive electrical devices (e.g., ICs and components) that are physically contained within a single housing (e.g., the device(s) are included on a common substrate (referred to herein as a "module substrate") or within a single package. A "module" also includes a plurality of conductive terminals for electrically connecting the set of devices to external circuitry that forms other portions of an electrical system. Essentially, the module substrate configuration, the method of coupling the device(s) to the module's terminals, and the number of devices within the module defines the module type. For example, in various embodiments, a module may be in the form of a surface mount device, a chip carrier device, a ball, pin, or land grid array device, a flat package (e.g., a quad or dual flat package) device, a chip scale packaged device, a system-in-package (SiP) device, or in the form of some other type of integrated circuit package. Although a particular type of module is described below, it is to be understood that embodiments of the inventive subject matter may be included in other types of modules, as well.

Figure 2:
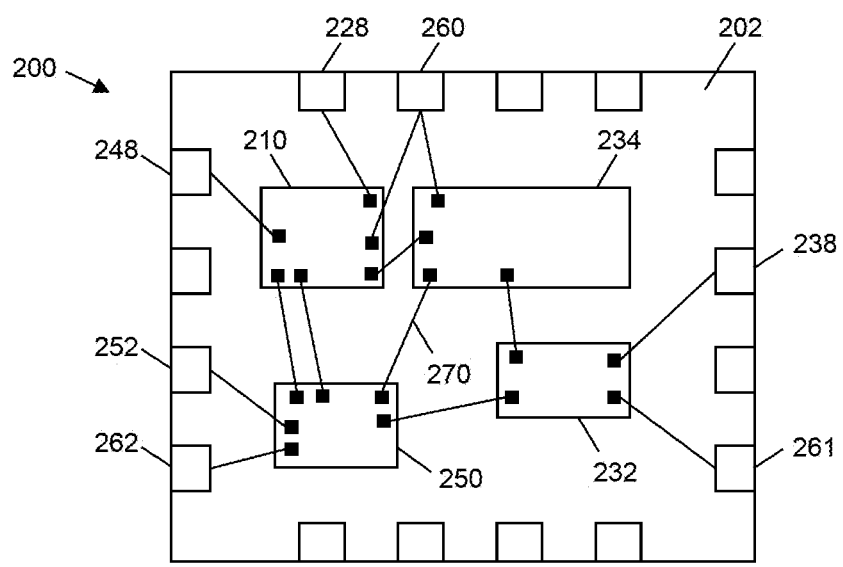
FIG. 2 is a top view of a module that embodies a portion of the RF transceiver system of FIG. 1, in accordance with an embodiment.

For example, FIG. 2 is a top view of a module 200 that embodies a portion of the RF transceiver system 100 of FIG. 1, in accordance with an embodiment. Module 200 includes a module substrate 202, which may be a relatively small PCB, a conductive flange, or another rigid structure. Module 200 also includes a plurality of ICs coupled to the module substrate 202, including an RF switch integrated circuit (IC) 210 (e.g., an IC that embodies RF switch 110, FIG. 1), a receive amplifier IC 232 (e.g., receive amplifier 132, FIG. 1), a receive matching circuit IC 234, and an RF switch controller IC 250. In addition, module 200 includes a transmit signal input terminal 228 (e.g., corresponding to transmitter node 128, FIG. 1), a receive signal output terminal 238 (e.g., corresponding to receiver node 138, FIG. 1), an antenna terminal 248 (e.g., corresponding to antenna terminal 148, FIG. 1), a transmit/receive (TX/RX) control signal terminal 252, one or more ground terminals 260, 261, and one or more power terminals 262. The various ICs 210, 232, 234, 250 and terminals 228, 238, 248, 252, 260-262 are electrically connected together through a plurality of wirebonds (e.g., wirebond 270). In other embodiments, various ones of the ICs 210, 232, 234, 250 and terminals 228, 238, 248, 252, 260-262 may be electrically connected together using other conductive structures (e.g., conductive traces on and within module substrate 202 and/or conductive vias through module substrate 202). In various embodiments, the module 200 may be housed in an air-cavity package or an overmolded (e.g., encapsulated) package, although the module 200 may be considered to be complete without such packaging, as well.

After incorporation of module 200 into a transceiver system (e.g., system 100, FIG. 1), and during operation of the transceiver system, power and ground reference voltages may be provided to module 200 through power and ground terminals 260-262. RF switch controller IC 250 may convert an input power voltage (e.g., +5.0 volts) received through power terminal 262. In addition, RF switch controller IC 250 may receive switch control signals (e.g., TTL level signals) through TX/RX control signal terminal 252. Based on the received switch control signals, the RF switch controller IC 250 provides switch control signals to control terminals (e.g., gates) of various transistors (e.g., transistors within switches 320, 324, 330, 334, FIG. 3) of the RF switch IC 210. As will be described in more detail later, the switch control signals determine whether each of the various transistors is in a conducting or non-conducting state at any given time. More specifically, the switch control signals determine whether the RF switch IC 210 is in a transmit state (i.e., a state in which the switch is configured to convey an RF signal from the transmitter 120 to the antenna 140) or a receive state (i.e., a state in which the switch is configured to convey an RF signal from the antenna 140 to the receiver 130) at any given time.

When the switch control signals configure the RF switch IC 210 in the transmit state, transmit signals received by the RF switch IC 210 from a power amplifier (e.g., power amplifier 124, FIG. 1) through the transmit signal input terminal 228 are passed through the RF switch IC 210 to the antenna terminal 248. Conversely, when the switch control signals place the RF switch IC 210 in the receive state, signals received from the antenna terminal 248 are passed through the RF switch IC 210 to the receive matching circuit IC 234. The receive matching circuit IC 234 may include one or more integrated passive devices (e.g., capacitors, inductors, and/or resistors). The integrated passive devices, along with inductances of the wirebonds 270 between the receive matching circuit IC 234, the RF switch IC 210, and the receive amplifier IC 232, compose an impedance matching circuit between the RF switch IC 210 and the receive amplifier IC 232. In an alternate embodiment, the receive matching circuit IC 234 may be replaced by discrete components. Either way, the impedance matching circuit also may perform filtering of receive signals that pass from the RF switch IC 210 to the receive amplifier IC 232 through the impedance matching circuit. The receive amplifier IC 232 receives the receive signals from the receive matching circuit IC 234, and amplifies the receive signals. The receive amplifier IC 232 then provides the amplified receive signals to receive signal output terminal 238.

Figure 3:
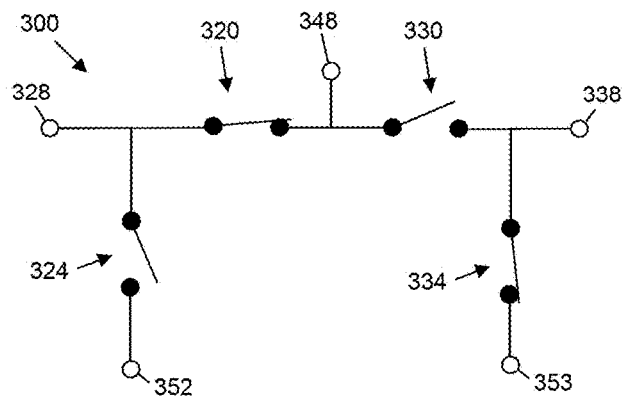
FIG. 3 is a simplified circuit diagram of an RF switch, in accordance with an embodiment.
Figure 4:
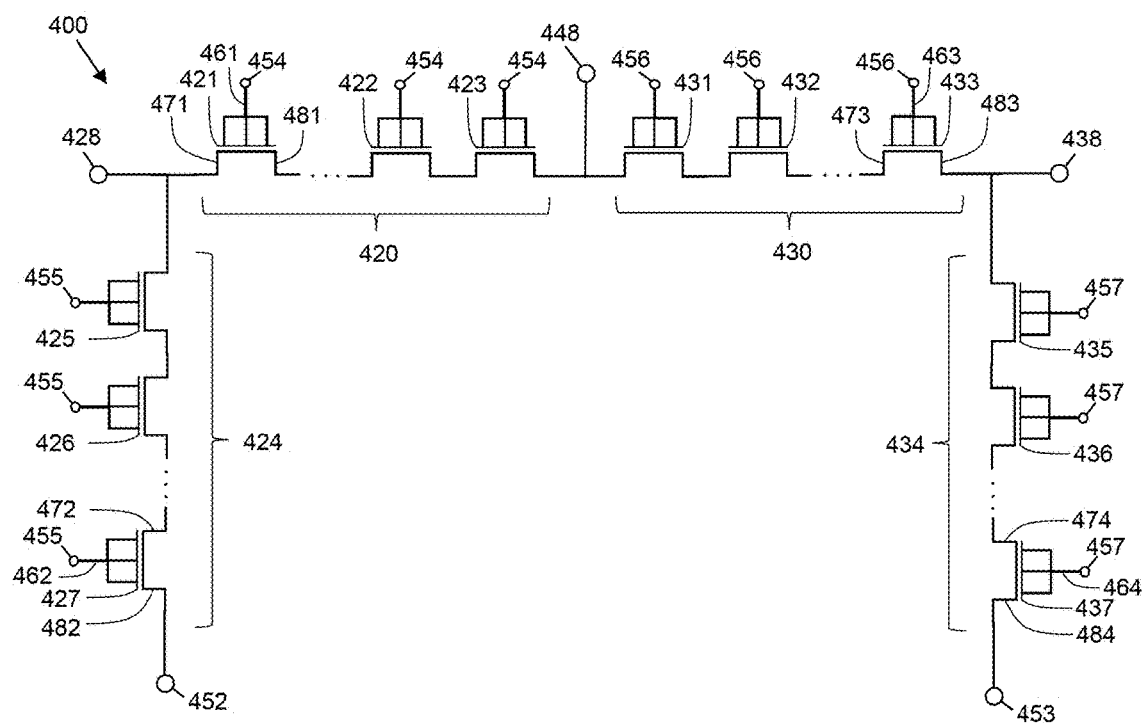
FIG. 4 is a simplified block diagram of a combination of FET stacks corresponding to the RF switch of FIG. 3, in accordance with an embodiment.

FIG. 3 is a simplified circuit diagram of an RF switch 300, in accordance with an embodiment, and FIG. 4 is a simplified block diagram of a corresponding RF switch 400 implemented as an arrangement of FET stacks 420, 424, 430, 434, in accordance with a more specific embodiment. RF switches 300, 400 each may provide the functionality of RF switch 110 (FIG. 1) and/or RF switch IC 210 (FIG. 2). RF switches 300, 400 each include a plurality of input/output (I/O) nodes, including a transmitter input 328/428 (e.g., transmitter node 128, FIG. 1), a receiver output 338/438 (e.g., receiver node 138, FIG. 1), an antenna I/O 348/448 (e.g., antenna node 148, FIG. 1), and voltage reference nodes 352/452, 353/453, in an embodiment. Transmitter input 328/428 and receiver output 338/438 may be generically referred to as a transmit/receive (T/R) node, herein.

RF switch 300 includes a plurality of switches 320, 324, 330, 334 electrically coupled between the various I/O nodes 328, 338, 348, 352, 353, with each switch 320, 323, 330, 334 being implemented as a stack 420, 424, 430, 434 of FETs in FIG. 4. At least some (and possibly all) of the FETs are multi-gate FETs, although some of the FETs may be single-gate FETs, as well. Accordingly, although the description below may refer to a stack of multi-gate FETs, it should be understood that not all of the FETs in a stack must be multi-gate FETs, and some stacks may include only single-gate FETs.

According to an embodiment, switch 320, which is coupled between the transmitter input 328 and antenna I/O 348, may be implemented as a first stack 420 of series-coupled multi-gate FETs 421, 422, 423 that are electrically coupled between transmitter input 428 and antenna I/O 448. Switch 324, which is coupled between the transmitter input 328 and voltage reference node 352, may be implemented as a second stack 424 of series-coupled multi-gate FETs 425, 426, 427 that are electrically coupled between transmitter input 428 and voltage reference node 452. Switch 330, which is coupled between the antenna I/O 348 and receiver output 338, may be implemented as a third stack 430 of series-coupled multi-gate FETs 431, 432, 433 that are electrically coupled between antenna I/O 448 and receiver output 438. Finally, switch 334, which is coupled between the receiver output 338 and voltage reference node 353, may be implemented as a fourth stack 434 of series-coupled multi-gate FETs 435, 436, 437 that are electrically coupled between receiver output 438 and voltage reference node 453. When incorporated into a larger electrical system, voltage reference nodes 352/452, 353/453 typically would be coupled to a ground reference (e.g., zero volts), although nodes 352/452, 353/453 alternatively could be coupled to a positive or negative DC voltage reference, as well.

Referring to FIG. 4, each FET 421-423, 425-427, 431-433, 435-437 includes a source terminal (e.g., terminals 471, 472, 473, 474), a drain terminal (e.g., terminals 481, 482, 483, 484), and a "multi-gate" structure (e.g., multi-gate structures 461, 462, 463, 464). The electrical conductivity of a "multi-gate FET channel" between the source and drain terminals is controlled by control signals provided to each multi-gate structure through a gate terminal (e.g., terminals 454, 455, 456, 457). As used herein, the term "multi-gate FET channel" refers to an entire variable-conductivity path between the source and drain terminals of a multi-gate FET. The term "multi-gate FET channel" will be more thoroughly defined in the context of the description of FIG. 7, later. According to an embodiment, the control signals provided to the multi-gate FETs in any particular stack 420, 424, 430, 434 are synchronous, in that they simultaneously cause all of the FETs in that stack either to be substantially conducting (e.g., "on" or "closed") or substantially non-conducting (e.g., "off" or "open").

As used herein, the term "series-coupled," in reference to the electrical coupling between multiple FETs in a stack, means that the current-conducting terminals (e.g., source/drain terminals) of the multiple FETs are connected together to provide a continuous electrically conductive channel/path between an input node (e.g., input 428) and an output node (e.g., antenna I/O 448) when the multiple FETs are in a conducting state (e.g., "on" or "closed"). For example, in the series-coupled sequence of multi-gate FETs corresponding to stack 420, the source terminal 471 of FET 421 may be coupled to transmit input 428, the drain terminal 481 of FET 421 may be coupled to the source terminal of FET 422, the drain terminal of FET 422 may be coupled to the source terminal of FET 423, and the drain terminal of FET 423 may be coupled to antenna I/O 448. Although the description herein refers to series-coupled arrangements in which a first FET has a source terminal connected to an input node, and has a drain terminal connected to a source terminal of a second FET, the source and drain terminal connections could be reversed, in other embodiments (e.g., a series-coupled arrangement may have a first FET with a drain terminal connected to an input node, and a source terminal connected to a drain terminal of a second FET). More generally, each of the source and drain terminals of a multi-gate FET may be referred to as a "current-conducting terminal," and that term could be used interchangeably for either a source terminal or a drain terminal.

In FIG. 4, each of the stacks 420, 424, 430, 434 of multi-gate FETs is shown to include three series-coupled FETs 421-423, 425-427, 431-433, 435-437. Although each of the stacks 420, 424, 430, 434 may include three series-coupled FETs in some embodiments, each of the stacks 420, 424, 430, 434 alternatively may include a single multi-gate FET, two multi-gate FETs, or more than three multi-gate FETs (as indicated with the ellipses in each FET stack). In some embodiments, either or both of the shunt stacks 424, 434 may not include any multi-gate FETs, and instead the transmitter input 428 and/or the receiver output 438 could be directly coupled to the corresponding voltage reference nodes 452, 453, respectively. The stacks 420, 424, 430, 434 may all include a same number of multi-gate FETs, or the stacks 420, 424, 430, 434 may include different numbers of multi-gate FETs from each other.

As described in conjunction with FIG. 1, during operation of the RF switch 300/400, the state of the RF switch 300/400 is controlled (e.g., by RF switch controller IC 250, FIG. 2) to alternate between coupling an RF transmit signal provided by the transmitter at transmitter input 328/428 to the antenna I/O 348/448, or coupling an RF receive signal provided by the antenna at antenna I/O 348/448 to the receiver through receiver output 338, 438. During each transmit time interval, the RF switch 300/400 is controlled to be in the transmit state, as depicted in FIG. 3, in which a transmit signal path is closed between transmitter node 328/428 and antenna I/O 348/448, and in which a receive signal path is open between antenna I/O 348/448 and receiver output 338/438. In the transmit state, switches 320 and 334 are closed, and switches 324 and 330 are open. Referring to FIG. 4, this means that control signals are sent to gate terminals 454 and 457 to cause multi-gate FETs 421-423 and 435-437 to be in a substantially conducting state, and control signals are sent to gate terminals 455 and 456 to cause multi-gate FETs 425-427 and 431-433 to be in a substantially non-conducting state. Accordingly, in the transmit state, signal energy present at transmitter input 328/428 is conveyed through switch 320 or stack 420 to antenna I/O 348/448, and the conductive path between transmitter input 328/428 and voltage reference node 452 is open. In addition, in the transmit state, signal energy present at receiver output 338/438 is conveyed through switch 334 or stack 434 to voltage reference node 453, and the conductive path between receiver output 338/438 and antenna I/O 348/448 is open.

Conversely, during each receive time interval, the RF switch 300/400 is controlled to be in the receive state, in which a receive signal path is closed between antenna I/O 348/448 and receiver node 338/438, and in which a transmit signal path is open between transmitter input 328/428 and antenna I/O 348/448. In the receive state, switches 330 and 324 are closed, and switches 320 and 334 are open. Referring to FIG. 4, this means that control signals are sent to gate terminals 455 and 456 to cause multi-gate FETs 425-427 and 431-433 to be in a substantially conducting state, and control signals are sent to gate terminals 454 and 457 to cause multi-gate FETs 421-423 and 435-437 to be in a substantially non-conducting state. Accordingly, in the receive state, signal energy present at antenna I/O 348/448 is conveyed through switch 330 or stack 430 to receiver output 338/438, and the conductive path between receiver output 338/438 and voltage reference node 453 is open. In addition, in the receive state, signal energy present at transmitter input 328/428 is conveyed through switch 324 or stack 424 to voltage reference node 452, and the conductive path between transmitter input 328/428 and antenna I/O 348/448 is open.

In the off-state, AC voltages across each stack 420, 424, 430, 434 are divided across the FETs of the stack. As used in this description, an "AC voltage" refers to a high frequency (e.g., 3 megahertz or more) and/or RF frequency (e.g., 3 megahertz to 300 gigahertz or more) voltage signal. Further, a voltage "across" a stack refers to a voltage across the input-to-output terminals (e.g., a voltage across terminals 428 to 448 of stack 420), and a voltage "across" a FET refers to a source-to-drain voltage (e.g., a voltage across terminals 453 to 463 of FET 421). Ideally, when the FETs of a stack are symmetrical (i.e., of equal size and/or power handling capability), the total AC voltage across each stack 420, 424, 430, 434 would be evenly divided across the FETs of the stack. However, in practice, uncompensated-for FET parasitics may cause an uneven division of the total off-state AC voltage across the FETs of each stack 420, 424, 430, 434. For example, assuming it is desired that the AC breakdown voltage of FET stack 420 is about 39 volts, and FET stack 420 includes three symmetrical FETs 421, 422, 423, each FET would desirably have an AC breakdown voltage of about 13 volts (i.e., 39 volts/3 FETs), and each FET would see about 13 volts across the FET just prior to breakdown of the entire stack 420.

Without implementation of an embodiment of the inventive subject matter, however, the off-state AC voltage distribution across the FETs in the stack may be unequal due to FET parasitics, even when the FETs are symmetrical in dimensions. More specifically, the FET that is electrically closer to the node that receives the incident voltage (i.e., the FET that is electrically closest to the input terminal for the signal being conveyed through the stack) may see significantly higher off-state AC voltages than the FET(s) that are electrically farther from the node that receives the incident voltage. In the RF switch 400, for example, FETs 421, 425, 431, and 435 are electrically closer to the node that receives the incident transmit or receive voltage signals conveyed through their corresponding FET stacks. In the above-given example, where a 39-volt stack AC breakdown voltage is desired, and without implementation of an embodiment of the inventive subject matter, the AC voltage across FET 421 may exceed the desired AC breakdown voltage of about 13 volts at the same time that FETs 422 and 423 experience AC voltages that are significantly below their 13-volt AC breakdown voltages. At that time, even though the total AC voltage across the stack has not reached the desired stack breakdown voltage, FET 421 may break down, followed immediately by the breakdowns of FETs 422 and 423. This represents an undesirable premature breakdown scenario (e.g., breakdown below the desired 39 volt FET stack AC breakdown voltage), which may detrimentally impact the power handling capability of the FET stack.

Embodiments of the inventive subject matter include implementations of a multi-gate FET, a multi-gate FET stack (i.e., a series-coupled combination of FETs, at least some of which are multi-gate FETs), and an RF switch IC (e.g., corresponding to RF switches 110, 210, 300, 400, FIGS. 1-4) that are configured so that, in the off state, the AC voltages may be substantially evenly divided across the multi-gate FETs of a stack (i.e., the off-state AC voltage across each FET in a stack may be substantially the same as the off-state AC voltage across the other FETs in the stack). As will be described in detail below, one or more multi-gate FETs in one or more FET stacks within a circuit (e.g., within RF switches 110, 210, 300, 400, FIGS. 1-4) include an embodiment of a "voltage leveling circuit". According to the various embodiments, the voltage leveling circuit(s) are configured to cause a more uniform distribution of off-state AC voltages (and also DC voltages, in some embodiments) across the FETs in a stack (e.g., across FETs 421-423 in stack 420, FETs 425-427 in stack 424, FETs 431-433 in stack 430, and/or FETs 435-437 in stack 434, FIG. 4).

Figure 5:
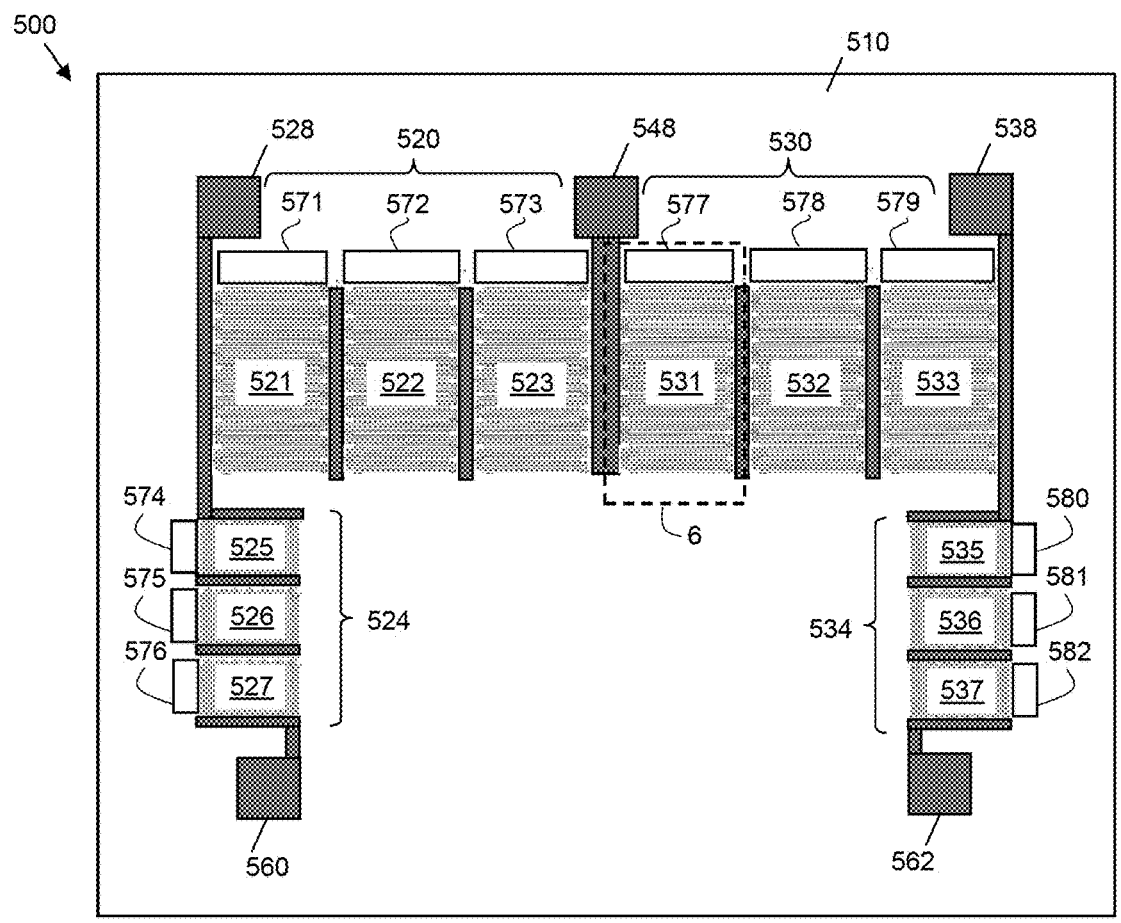
FIG. 5 is a top view of a monolithic RF switch integrated circuit (IC) that embodies the combination of FET stacks of FIG. 4, in accordance with an embodiment.

FIG. 5 is a top view of a monolithic RF switch IC 500 that embodies the combination of FET stacks of FIG. 4, and that includes a plurality of voltage leveling circuits, in accordance with an embodiment. For enhanced understanding, FIG. 5 should be viewed simultaneously with FIGS. 6 and 7, which are enlarged top and cross-sectional side views of RF switch IC 500.

Referring first to FIG. 5, RF switch IC 500 includes a plurality of FET stacks 520, 524, 530, 534 (e.g., FET stacks 420, 424, 430, 434, FIG. 4), each of which includes three, series-coupled multi-gate FETs 521-523, 525-527, 531-533, 535-537 (e.g., multi-gate FETs 421-423, 425-427, 431-433, 435-437, FIG. 4). According to an embodiment, the FET stacks 520, 524, 530, 534 may form portions of a single, monolithic semiconductor chip (i.e., a single semiconductor substrate). Alternatively, some or all of the FET stacks 520, 524, 530, 534 may be included within distinct semiconductor chips that are electrically connected together using wirebonds and/or other electrically conductive structures.

Figure 7:
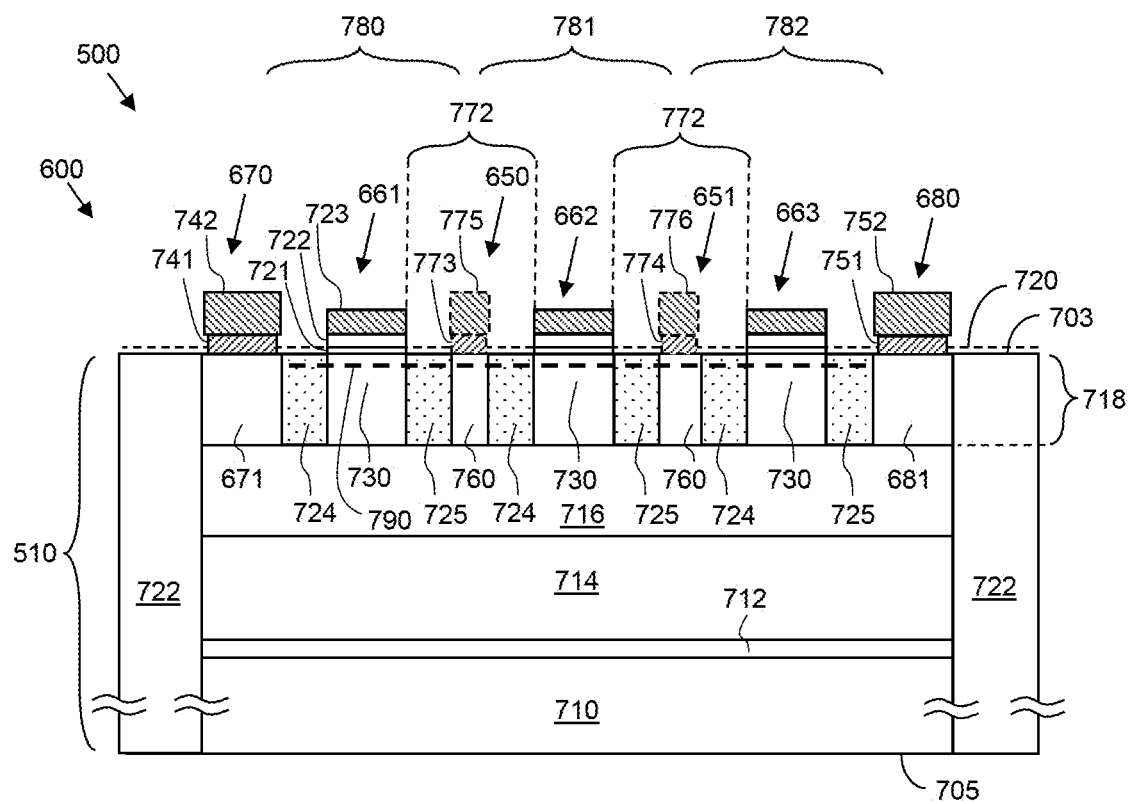
FIG. 7 is a cross-sectional, side view of the multi-gate FET of FIG. 6 along line 7-7, in accordance with an embodiment.

According to on embodiment, the RF switch IC 500 is "monolithic," in that the FETs 521-523, 525-527, 531-533, 535-537 are formed in and on a single integrated circuit substrate 510. For example, according to an embodiment, the RF switch IC 500 may be formed on a gallium arsenide (GaAs)-based substrate 510, and such an embodiment is described in more detail below in conjunction with FIG. 7. Although a GaAs-based device is described herein, those of skill in the art would understand, based on the description herein, that the inventive subject matter also may be implemented in RF devices that are formed on other types of substrates, as well, including silicon (Si)-based substrates (e.g., bulk Si CMOS, silicon-on insulator (SoI) CMOS, and so on) and gallium nitride (GaN)-based substrates (e.g., GaN on silicon, GaN on silicon carbide (SiC), and so on). Further, although a particular pseudomorphic high electron mobility transistors (pHEMTs) configuration is illustrated in FIG. 7 and described in detail below, those of skill in the art would understand, based on the description herein, that the inventive subject matter may be implemented in a variety of differently configured, gate-controlled, three-terminal components or transistors, including differently-configured pHEMTs, metal oxide semiconductor FETs (MOSFETs), high electron mobility transistors (HEMTs), metal-semiconductor field effect transistors (MESFETs), laterally diffused metal-oxide semiconductor (LDMOS) FETs, Enhancement-mode MOSFETs (EMOSFETs), and junction gate FETs (JFETs), to name a few.

In addition to FET stacks 520, 524, 530, 534, RF switch IC 500 includes a plurality of I/O nodes 528, 538, 548, 560, 562, each of which may provide for electrical connectivity with external circuitry (e.g., connectivity with antenna 140, transmitter 120, receiver 130, receive matching circuit IC 234, RF switch controller IC 250, and so on) and/or electrical connectivity with one or more power sources and/or voltage references (e.g., power, ground and other voltage references). For example, some or all of the I/O nodes 528, 538, 548, 560, 562 may be implemented as conductive pads that are exposed at a top surface of the RF switch IC 500. Accordingly, the I/O nodes 528, 538, 548, 560, 562 may serve as bond pads for wirebonds (e.g., wirebonds 270, FIG. 2), which provide for electrical connectivity to the above-mentioned external circuitry or to other circuitry. According to an embodiment, the I/O nodes include a transmitter input node 528 (e.g., transmitter node 128, 328, 428, FIGS. 1, 3, 4), a receiver output node 538 (e.g., receiver node 138, 338, 438, FIGS. 1, 3, 4), an antenna I/O node 548 (e.g., antenna node 148, 348, 448, FIGS. 1, 3, 4), and voltage reference nodes 560, 562 (e.g., reference nodes 352, 353, 452, 453, FIGS. 3, 4).

The electrical conductivity of a FET channel between the source and drain terminals is controlled by control signals provided to each multi-gate structure through a gate terminal (e.g., terminals 454, 455, 456, 457, FIG. 4). To enable such channel conductivity control, RF switch IC 500 also includes a plurality of control nodes (not illustrated) that enable control signals to be provided by external circuitry to the FET stacks 520, 524, 530, 534, and more particularly to the gate terminals of the FETs 521-523, 525-527, 531-533, 535-537. According to an embodiment, the control signals provided to the multi-gate FETs in any particular stack 520, 524, 530, 534 are synchronous, in that they simultaneously cause all of the FETs in that stack either to be substantially conducting (e.g., "on" or "closed") or substantially non-conducting (e.g., "off" or "open").

First FET stack 520, consisting of series-coupled multi-gate FETs 521, 522, 523, is electrically coupled between transmitter input node 528 and antenna I/O node 548. More specifically, a drain terminal of FET 521 is electrically coupled to transmitter input node 528, a source terminal of FET 521 is electrically coupled to a drain terminal of FET 522, a source terminal of FET 522 is electrically coupled to a drain terminal of FET 523, and a source terminal of FET 523 is electrically coupled to antenna I/O node 548, in an embodiment.

Second FET stack 524, consisting of series-coupled multi-gate FETs 525, 526, 527, is electrically coupled between transmitter input node 528 and voltage reference node 560. More specifically, a drain terminal of FET 525 is electrically coupled to transmitter input node 528, a source terminal of FET 525 is electrically coupled to a drain terminal of FET 526, a source terminal of FET 526 is electrically coupled to a drain terminal of FET 527, and a source terminal of FET 527 is electrically coupled to voltage reference node 560, in an embodiment.

Third stack 530, consisting of series-coupled multi-gate FETs 531, 532, 533, is electrically coupled between antenna I/O node 548 and receiver output node 538. More specifically, a drain terminal of FET 531 is electrically coupled to antenna I/O node 548, a source terminal of FET 531 is electrically coupled to a drain terminal of FET 532, a source terminal of FET 532 is electrically coupled to a drain terminal of FET 524, and a source terminal of FET 524 is electrically coupled to receiver output node 538, in an embodiment.

Finally, fourth stack 534, consisting of series-coupled multi-gate FETs 535, 536, 537, is electrically coupled between receiver output node 538 and voltage reference node 562. More specifically, a drain terminal of FET 535 is electrically coupled to receiver output node 538, a source terminal of FET 535 is electrically coupled to a drain terminal of FET 536, a source terminal of FET 536 is electrically coupled to a drain terminal of FET 537, and a source terminal of FET 5327 is electrically coupled to voltage reference node 562, in an embodiment. When incorporated into a larger electrical system, voltage reference nodes 560, 562 typically would be coupled to a ground reference (e.g., zero volts), although nodes 560, 562 alternatively could be coupled to a positive or negative DC voltage reference, as well.

As will be described in more detail in conjunction with FIGS. 6-11, a voltage leveling circuit 571, 573, 573, 574, 575, 576, 577, 578, 579, 580, 581, 582 may be electrically coupled to some or all of FETs 521-523, 525-227, 531-533, 535-537. As discussed previously, the voltage leveling circuit(s) 571-582 are configured to cause a more uniform distribution of off-state AC voltages (and also DC voltages, in some embodiments) across the FETs in each stack 520, 524, 530, 534. In FIG. 5, the voltage leveling circuits 571-582 each are given distinct reference numbers to accentuate the point that the voltage leveling circuits may be different from each other. For example, various embodiments of voltage leveling circuits are illustrated in FIGS. 8-11, which are described in detail later. However, the voltage leveling circuits 571-582 may be substantially the same, as well. Further, in some embodiments, as few as one voltage leveling circuit 571-582 may be electrically coupled to as few as one multi-gate FET 521-523, 525-527, 531-533, 535-537, in some embodiments, or as few as one FET in each stack 520, 524, 530, 534. For example, it may be particularly advantageous to couple a voltage leveling circuit 571, 574, 577, 580 to at least a first FET 521, 525, 531, 535 of a FET stack 520, 524, 530, 534 (e.g., to a FET that is electrically closest to an incident signal).

Figure 6:
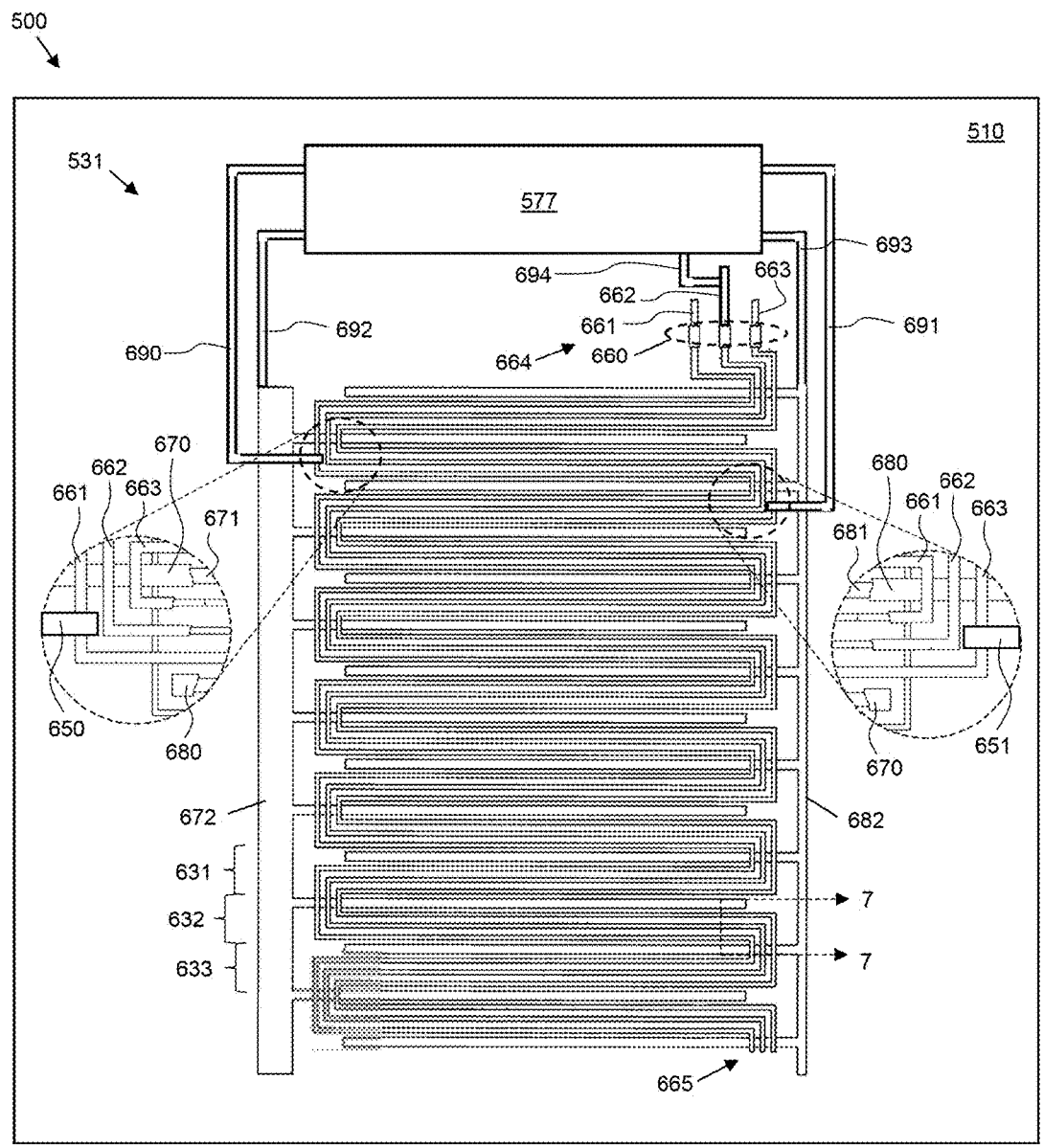
FIG. 6 is an enlarged, top view of a multi-gate FET and voltage leveling circuit of the RF switch IC of FIG. 5, in accordance with an embodiment.

Reference is now made to FIG. 6, which is an enlarged top view of multi-gate FET 531 of FIG. 5 (i.e., FET 531 enclosed by dashed box 6 in FIG. 5). FIG. 6 should be viewed in parallel with FIG. 7, which is a cross-sectional, side view of a transistor finger along line 7-7 of FIG. 6. It should be noted that, in FIG. 6, two portions of FET 531 are shown enlarged (in dashed circles) to better illustrate features of the various embodiments.

Referring first to FIG. 6, multi-gate FET 531 includes a plurality of transistor "fingers" (e.g., fingers 631, 632, 633), which are formed in and on a semiconductor substrate 510. The transistor fingers of FET 531 are arranged in parallel with each other, with each finger conveying a portion of the signal between the FET's input and output terminals. Each transistor finger includes a source terminal 670 overlying a source region 671 (e.g., terminals 471, 472, 473, 474, FIG.

4), and a drain terminal 680 overlying a drain region 681 (e.g., terminals 481, 482, 483, 484, FIG. 4), where the source and drain terminals 670, 680 and regions 671, 681 are elongated (in the horizontal direction in FIG. 6), and each extends substantially the width of the transistor finger. The multiple source terminals 670 of the FET 531 are electrically coupled together with a conductive source bar 672 (extending in the vertical direction in FIG. 6), and the multiple drain terminals 680 of the FET 531 similarly are electrically coupled together with a conductive drain bar 682 (also extending in the vertical direction in FIG. 6). As used herein, a "source terminal" may refer to a single source terminal (e.g., one instance of terminal 670) or to the electrically connected assembly of multiple, horizontal source terminals and the vertical source bar 672. Similarly, as used herein, the "drain terminal" may refer to a single drain terminal (e.g., one instance of terminal 680) or to the electrically connected assembly of multiple, horizontal drain contacts and the vertical drain bar 682.

A multi-gate assembly 660 is positioned over the portions of the semiconductor substrate 510 between each pair of directly adjacent source and drain regions 671, 681 (or between each pair of directly adjacent source and drain terminals 670, 680). As used herein, the term "directly adjacent," when referring to two elements, means that no elements of the same type as either or both of the elements are physically positioned in-between the directly adjacent elements.

In the embodiment of FIG. 6, the multi-gate assembly 660 includes three elongated gate structures 661, 662, 663, which extend in parallel with each other in a serpentine manner between first and second ends 664, 665 of the multi-gate assembly 660. Although the elongated gate structures 661-663 may be electrically isolated from each other between the first and second ends 664, 665 of the multi-gate assembly 660, the gate structures 661-663 may be electrically connected together at or before the first end 664 so that synchronous channel control signals can be provided to the gate structures 661-663 during operation. More specifically, during operation, channel control signals are provided to the multi-gate assembly 660 (e.g., synchronously to the gate structures 661-663) to control the electrical conductivity of channel regions of the substrate 510 (e.g., channel regions 730, FIG. 7) that are located between directly adjacent source and drain regions 671, 681.

According to various embodiments, a voltage leveling circuit 577 is electrically connected to FET 531. Depending on the embodiment selected for voltage leveling circuit 577, multiple electrical connections 690-694 may be specifically implemented between the voltage leveling circuit 577 and FET 531. The electrical connections 690-694 each may include one or more conductive traces of one or more metal layers of the device, along with conductive vias electrically connecting the conductive traces. For example, the electrical connections may include a combination of: a) one or more electrical connections 690, 691 between the voltage leveling circuit 577 and portions of the semiconductor substrate 510 between directly adjacent gate structures 661-663; b) electrical connections 692, 693 between the voltage leveling circuit 577 and the source and/or drain terminals 670, 680 (and/or the source bar 672 or drain bar 682); and/or c) electrical connection(s) 694 to the multi-gate assembly 660, and more particularly to one or more of the gate structures 661-663. The various embodiments of voltage leveling circuits and their associated electrical connections to a multi-gate FET will be described in more detail later in conjunction with FIGS. 8-11.

To better understand the construction of an embodiment of a single transistor finger, reference is made to FIG. 7, which is a simplified schematic cross-sectional view through one transistor finger 632 of multi-gate FET 531, and more specifically through line 7-7 in FIG. 6. In the below description, FET 531 is described as a pseudomorphic high electron mobility transistors (pHEMT). In other embodiments, FET 531 may have another type of structure (e.g., FET 531 may be a differently-configured pHEMT, a MOSFET, another type of HEMT, a MESFET, an LDMOS FET, an EMOSFET, or a JFET, among other structures). Further, although substrate 510 is described as being a GaAs substrate, substrate 510 may be formed from other semiconductor materials, in other embodiments (e.g., substrate may be a silicon-based substrate, a gallium nitride-based substrate, or another suitable type of semiconductor substrate).

As shown in FIG. 7, substrate 510 is defined by a top surface 703 (also referred to as an "active surface" herein) and a bottom surface 705. According to an embodiment, substrate 510 includes a base substrate 710 (e.g., a single crystal GaAs substrate), with a plurality of layers overlying the base substrate 710. For example, the plurality of layers may include an optional buffer layer 712 configured to reduce device leakage. Buffer layer 712 may, for example, be comprised of one or more layers of GaAs and/or aluminum GaAs (AlGaAs). One or more additional GaAs layers 714 may be provided (e.g., epitaxially grown) on base substrate 710 or on the buffer layer 712, if included. Next, a layer 716 of indium GaAs (InGaAs) is formed (e.g., epitaxially grown) on or over GaAs layer(s) 714. Substantially insulating AlGaAs layer 718 is then formed on or over layer 716, and substantially intrinsic GaAs layer 720 is then formed on or over layer 718. Substantially insulating lateral isolation walls 722 are desirably but not essentially formed surrounding multi-gate FET 531.

First gate conductors 722, desirably of a refractory highly conductive metal or semi-metal, are formed on portions 721 of upper GaAs layer 720. Most of layer 720 (except portions 721 under gate regions 722) is subsequently removed, leaving GaAs layer portions 721 beneath each gate conductor 722.

Gate conductors 722 and underlying portions 721 of layer 720 may be used as a mask, where exposed portions of the substrate top surface 703 between the gate conductors 722 allow light N doping of AlGaAs layer 718 on either side of gate conductors 722. This provides lightly doped N type regions 724, 725 in layer 718 on either side of gate conductors 722. Regions 724 essentially function as inter-gate source regions, and regions 725 essentially function as inter-gate drain regions. Channel regions 730 beneath gate conductors 722 may remain as substantially undoped insulating AlGaAs. Subsequently, layer 718 outside of channel regions 730 may be further N doped to provide source region 671 (e.g., source region 671, FIG. 6), drain region 681 (e.g., drain region 681, FIG. 6), and intermediate regions 760.

The multi-gate assembly 660 (e.g., multi-gate assembly 660, FIG. 6), consisting of gate structures 661, 662, 663, is completed by forming metal conductors 723 (e.g., from gold or other suitable materials) over gate conductors 722. This may function to reduce the gate series resistance. Adjacent pairs of gate structures (e.g., adjacent pair 661 and 662, and adjacent pair 662 and 663) are separated from each other by distance or separation 772.

To form source and drain terminals 670, 680 (e.g., source and drain terminals 670, 680, FIG. 6), source and drain contacts 741, 751 are formed on source and drain regions 671, 681, respectively, and source and drain metal conductors 742, 752 are formed on the source and drain contacts 741, 751, respectively. For example, contacts 741, 751 may be formed from a suitable ohmic contact material, such as nickel germanium gold (NiGeAu) or other suitable materials. Conductors 742, 752 may be formed from gold or other highly conductive materials.

As previously mentioned, the term "multi-gate FET channel," as used herein, refers to an entire variable-conductivity path between the source and drain terminals of a multi-gate FET (e.g., between source and drain terminals 670, 680 of FET 531). For example, in FIG. 7, a "multi-gate FET channel" is present between source and drain terminals 670, 680, and the multi-gate FET channel includes consecutive portions of all regions 724, 730, 725, and 760 located between source region 671 and drain region 681, as indicated by dashed line 790.

Voltage leveling circuit terminals 650, 651 (e.g., terminals 650, 651, FIG. 6) are coupled to the top surface 703 of the substrate 510 within the separations 772 between adjacent pairs of the gate structures 661, 662, 663, according to an embodiment. The voltage leveling circuit terminals 650, 651 are, in turn, electrically connected to electrical connections 690, 691 to the voltage leveling circuit 577. The voltage leveling circuit terminals 650, 651 may be ohmic contacts, for example, which are formed from contacts 773, 774 and conductors 774, 775. For example, contacts 773, 774 may be formed from a suitable ohmic contact material, such as NiGeAu or another suitable material. Conductors 775, 776 may be formed from gold or other highly conductive materials. In FIG. 7, voltage leveling circuit terminals 650, 651 are depicted with dashed boxes, as the terminals 650, 651 are not dissected by the specific cross-section of FIG. 7 (i.e., the cross-section indicated by line 7-7 in FIG. 6). However, the inclusion of terminals 650, 651 in FIG. 7 is intended to clearly illustrate that the first voltage leveling circuit terminal 650 makes contact (e.g., ohmic contact) with the intermediate region 760 between a first pair of adjacent gate structures 661 and 662, and the second voltage leveling circuit terminal 651 makes contact (e.g., ohmic contact) with the intermediate region 760 between a second pair of adjacent gate structures 662 and 663. As shown more clearly in the enlarged portions of FIG. 6, it may be desirable to provide the voltage leveling circuit terminals 650, 651 at spatially distant locations for layout convenience.

Essentially, each finger of multi-gate FET 531 includes three series-connected devices 780, 781, 782. According to an embodiment, devices 780-782 are symmetrical. In alternate embodiments, the devices 780-782 may be asymmetrical. Those of skill in the art would understand, based on the description herein, that alternate embodiments of a multi-gate FET can have any practical number, n (e.g., 2<n<10 or more), of parallel-coupled but serially arranged gate structures.

Referring again to FIG. 5, in addition to the aforementioned elements, RF switch IC 500 includes additional control nodes (e.g., additional conductive pads, not shown), which may be electrically coupled to an RF switch controller (e.g., RF switch controller 250, FIG. 2). The control nodes are configured to receive channel control signals, which are conveyed to the multi-gate FETs 521-523, 525-527, 531-533, 535-537 (and more specifically to the gate terminals of the multi-gate FETs) in order to control the electrical conductivity of the FET channels (i.e., to turn the FETs "on" or "off"). More specifically, the channel control signals determine whether the RF switch IC 500 is in a transmit state (i.e., a state in which the switch is configured to convey an RF signal between transmitter input node 528 and antenna I/O node 548) or a receive state (i.e., a state in which the switch is configured to convey an RF signal from the antenna I/O node 548 to the receiver input node 538) at any given time.

When the switch control signals configure the RF switch IC 500 in the transmit state, transmit signals received by the RF switch IC 500 from a power amplifier (e.g., power amplifier 124, FIG. 1) through the transmit signal input terminal 528 are passed through stack 520 to the antenna terminal 548 (and subsequently to antenna 148, FIG. 1). Conversely, when the switch control signals place the RF switch IC 500 in the receive state, signals received from the antenna terminal 548 are passed through stack 530 to the receive signal output terminal 538 (and subsequently to power amplifier 132, FIG. 1).

FIGS. 8-11 are simplified circuit diagrams of various embodiments of voltage leveling circuits (e.g., circuits 571-582, FIGS. 5, 6) electrically coupled to multi-gate FETs (e.g., FETs 421-423, 425-427, 431-433, 435-437, 521-523, 525-527, 531-533, 535-537, FIGS. 4-6). In each of the various embodiments, a multi-gate FET includes a multi-gate assembly with at least one pair of adjacent gate structures coupled to the active surface of a semiconductor substrate over a multi-gate FET channel that extends between a source terminal and a drain terminal. Each of the various embodiments also includes a voltage leveling circuit with at least one channel contact coupled to the active surface between at least one pair of the adjacent gate structures. The voltage leveling circuit also includes one or more passive components (e.g., capacitors, resistors, and/or inductors) electrically coupled between the channel contact(s) and the source terminal, the drain terminal, and/or one or more of the gate structures.

Figure 8:
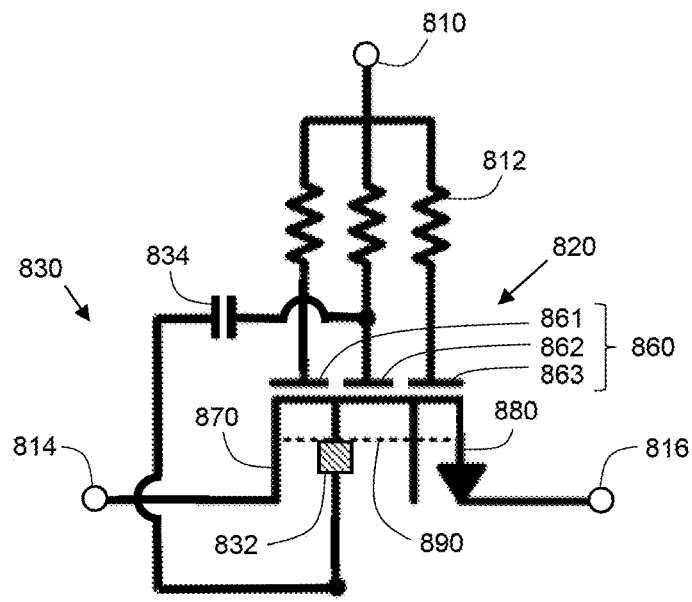
FIG. 8 is a simplified circuit diagram of a voltage leveling circuit electrically coupled to a multi-gate FET, in accordance with an embodiment.

For example, FIG. 8 is a simplified circuit diagram of a voltage leveling circuit 830 (e.g., an instance of one of circuit 571-582, FIGS. 5, 6) electrically coupled to a multi-gate FET 820 (e.g., any one of FETs 421-423, 425-427, 431-433, 435-437, 521-523, 525-527, 531-533, 535-537, FIGS. 4-6), in accordance with an embodiment. The multi-gate FET 820 is formed in and on a semiconductor substrate (e.g., substrate 510, FIGS. 5-7), and includes a source terminal 870 (e.g., source terminal 670, FIGS. 6, 7), a drain terminal 880 (e.g., drain terminal 680, FIGS. 6, 7), a multi-gate FET channel 890 (e.g., channel 790, FIG. 7) between the source and drain terminals 870, 880, and a multi-gate assembly 860 (e.g., assembly 660, FIG. 6) with a plurality of gate structures 861, 862, 863 (e.g., gate structures 661-663, FIGS. 6, 7) over the multi-gate FET channel 890. Although FIG. 8 depicts a multi-gate assembly 860 with three gate structures 861-863, other FET embodiments may include a multi-gate assembly with only two gate structures, or with more than three gate structures.

The multi-gate assembly 860 is electrically coupled to a gate terminal 810 (e.g., any of terminals 454-457, FIG. 4) through a plurality of resistances 812. The source terminal 870 is electrically coupled to a first node 814 (e.g., directly or indirectly coupled to any of nodes 428, 448, 438, FIG. 4, or to the drain terminal of another FET), and the drain terminal 880 is electrically coupled to an output node (e.g., directly or indirectly coupled to any of nodes 438, 448, 452, 453, FIG. 4 or to the source terminal of another FET).

The voltage leveling circuit 830 includes a channel contact 832 (e.g., channel contact 650 or 651, FIGS. 6, 7), and a capacitor 834, according to an embodiment. As discussed previously, the channel contact 832 may be, for example, an ohmic contact that is electrically coupled to the active surface of the semiconductor substrate over the multi-gate FET channel 890 between a first pair of adjacent gate structures 861, 862. Although the channel contact 832 is shown to be positioned between gate structures 861, 862, the channel contact 832 alternatively could be positioned between adjacent gate structures 862 and 863.

Through various electrical connections (e.g., integrated electrical connections 690 or 691, FIG. 6), the channel contact 832 is electrically coupled to a first terminal (or electrode or plate) of capacitor 834, and a second terminal (or electrode or plate) of capacitor 834 is electrically coupled to the multi-gate assembly 860 through additional electrical connections (e.g., integrated electrical connection 694, FIG. 6). In the embodiment illustrated in FIG. 8, the second terminal of capacitor 834 is electrically coupled to a central gate structure 862. In other embodiments, the second terminal of capacitor 834 may be electrically coupled to another one of the gate structures 861 or 863, or to a plurality of the gate structures 861-863.

According to an embodiment, capacitor 834 may be a metal-insulator-metal (MIM) capacitor that is integrally formed with the substrate, which includes, for example, a first electrode formed from a portion of a first metal layer, a second electrode formed from a portion of a second metal layer, and an insulating layer (e.g., silicon nitride or other suitable insulating materials) sandwiched between the first and second electrodes. In other embodiments, capacitor 834 may be a discrete capacitor that is electrically coupled to the top surface of the semiconductor substrate. Either way, capacitor 834 has a capacitance value in a range of about 0.05 picofarads (pF) to about 5.0 pF, in an embodiment. In other embodiments, capacitor 834 may have a lower or higher capacitance value than the above-given range.

Although capacitor 834 is illustrated as a single component in FIG. 8, capacitor 834 may be implemented as a network of parallel-coupled and/or series coupled capacitors, in other embodiments. Further, one or more other passive components (e.g., inductances and/or resistances) may be electrically connected between channel contact 832 and gate assembly 860 in series or parallel with capacitor 834, in other embodiments.

As discussed previously, when implemented in a system with a stack of multi-gate FETs, the voltage leveling circuit 830 may result in a more uniform, off-state AC voltage distribution across the FETs of the stack.

Figure 9:
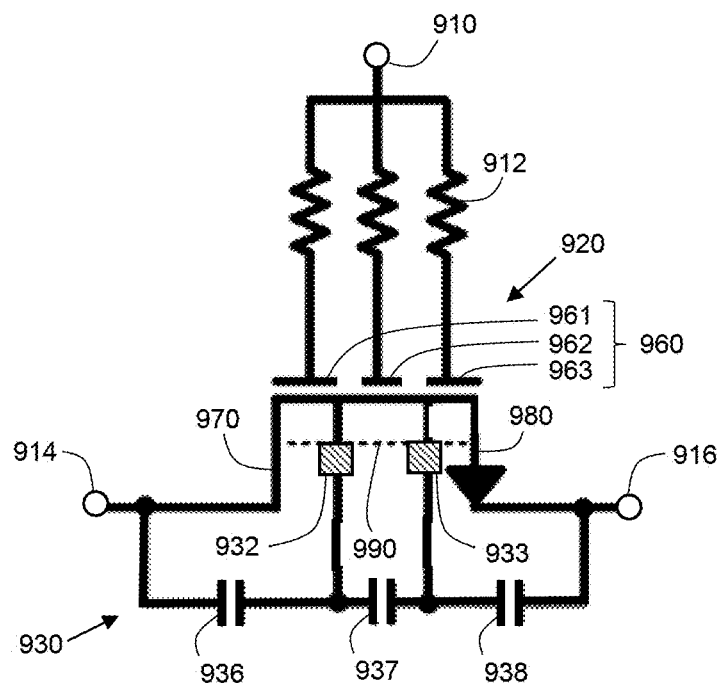
FIG. 9 is a simplified circuit diagram of a voltage leveling circuit electrically coupled to a multi-gate FET, in accordance with another embodiment.

FIG. 9 is a simplified circuit diagram of a voltage leveling circuit 930 (e.g., an instance of one of circuit 571-582, FIGS. 5, 6) electrically coupled to a multi-gate FET 920 (e.g., any one of FETs 421-423, 425-427, 431-433, 435-437, 521-523, 525-527, 531-533, 535-537, FIGS. 4-6), in accordance with another embodiment. The multi-gate FET 920 is formed in and on a semiconductor substrate (e.g., substrate 510, FIGS. 5-7), and includes a source terminal 970 (e.g., source terminal 670, FIGS. 6, 7), a drain terminal 980 (e.g., drain terminal 680, FIGS. 6, 7), a multi-gate FET channel 990 (e.g., channel 790, FIG. 7) between the source and drain terminals 970, 980, and a multi-gate assembly 960 (e.g., assembly 660, FIG. 6) with a plurality of gate structures 961, 962, 963 (e.g., gate structures 661-663, FIGS. 6, 7) over the multi-gate FET channel 990. Although FIG. 9 depicts a multi-gate assembly 960 with three gate structures 961-963, other FET embodiments may include a multi-gate assembly with only two gate structures, or with more than three gate structures.

The multi-gate assembly 960 is electrically coupled to a gate terminal 910 (e.g., any of terminals 454-457, FIG. 4) through a plurality of resistances 912. The source terminal 970 is electrically coupled to a first node 914 (e.g., directly or indirectly coupled to any of nodes 428, 448, 438, FIG. 4, or to the drain terminal of another FET), and the drain terminal 980 is electrically coupled to a second node 916 (e.g., directly or indirectly coupled to any of nodes 438, 448, 452, 453, FIG. 4, or to the source terminal of another FET).

The voltage leveling circuit 930 is electrically connected between the source terminal 970 and the drain terminal 980. Circuit 930 includes a plurality of channel contacts 932, 933 (e.g., channel contacts 650 and 651, FIGS. 6, 7), and a plurality of capacitors 936, 937, 938, according to an embodiment. As discussed previously, the channel contacts 932, 933 may be, for example, ohmic contacts that are electrically coupled to the active surface of the semiconductor substrate over the multi-gate FET channel 990, where a first channel contact 932 is positioned between a first pair of adjacent gate structures 961, 962, and a second channel contact 933 is positioned between a second pair of adjacent gate structures 962, 963.

Through various electrical connections (e.g., integrated electrical connections 690-693, FIG. 6), the channel contacts 932, 933 are electrically coupled to capacitors 936-938, and capacitors 936-938 are electrically coupled to the source and drain terminals 970, 980. More specifically, a first terminal (or electrode or plate) of capacitor 936 is electrically coupled to the source terminal 970, and a second terminal (or electrode or plate) of capacitor 936 is electrically coupled to the first channel contact 932 and also to a first terminal (or electrode or plate) of capacitor 937. The first terminal of capacitor 937 also is electrically coupled to the first channel contact 932, and a second terminal of capacitor 937 is electrically coupled to the second channel contact 933 and also to a first terminal (or electrode or plate) of the third capacitor 938. The first terminal of capacitor 938 also is electrically coupled to the second channel contact 933, and a second terminal (or electrode or plate) of capacitor 938 is electrically coupled to the drain terminal 980.

According to an embodiment, capacitors 936-938 may be MIM capacitors that are integrally formed with the substrate. In other embodiments, one or more of capacitors 936-938 may be a discrete capacitor that is electrically coupled to the top surface of the semiconductor substrate. Either way, each of capacitors 936-938 has a capacitance value in a range of about 0.05 pF to about 5.0 pF, in an embodiment. In other embodiments, one or more of capacitors 936-938 may have a lower or higher capacitance value than the above-given range.

Although each of capacitors 936-938 is illustrated as a single component in FIG. 9, one or more of capacitors 936-938 may be implemented as a network of parallel-coupled and/or series coupled capacitors, in other embodiments. Further, one or more other passive components (e.g., inductances and/or resistances) may be electrically connected between the source and drain terminals 970-980 and to the channel contacts 932, 933 in series or parallel with capacitors 936-938, in other embodiments.

As discussed previously, when implemented in a system with a stack of multi-gate FETs, the voltage leveling circuit 930 may result in a more uniform, off-state AC voltage distribution across the FETs of the stack. More specifically, by utilizing equalizing capacitors 936-938 connected as shown in FIG. 9, AC voltage swing may be substantially equalized across all FETs in an off-state FET branch of an RF switch (or across multi-gate FETs in a different type of circuit), thereby potentially preventing the first and/or first few multi-gate FETs from experiencing the stack breakdown voltage before the rest of the multi-gate FETs in the off-state branch. This may significantly improve the power handling capability of the switch.

Figure 10:
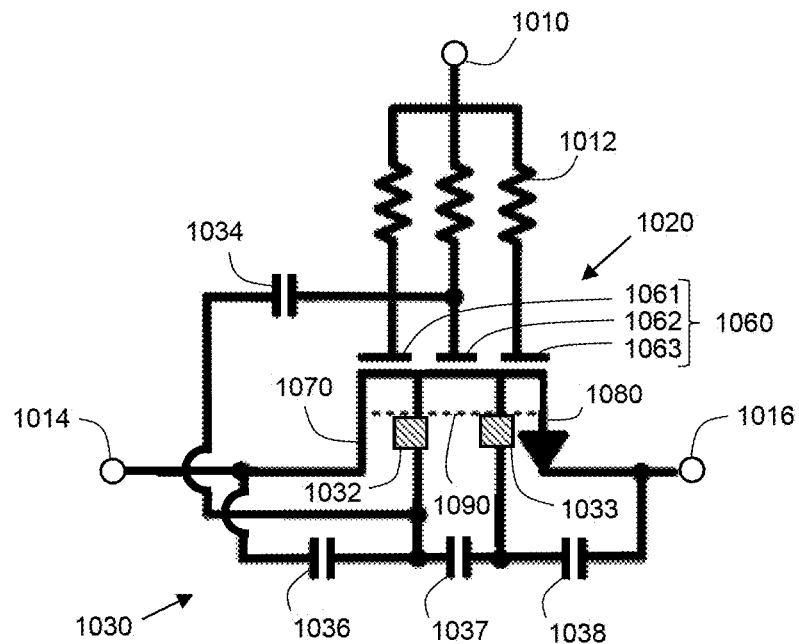
FIG. 10 is a simplified circuit diagram of a voltage leveling circuit electrically coupled to a multi-gate FET, in accordance with yet another embodiment.

FIG. 10 is a simplified circuit diagram of a voltage leveling circuit 1030 (e.g., an instance of one of circuit 571-582, FIGS. 5, 6) electrically coupled to a multi-gate FET 1020 (e.g., any one of FETs 421-423, 425-427, 431-433, 435-437, 521-523, 525-527, 531-533, 535-537, FIGS. 4-6), in accordance with yet another embodiment. Voltage leveling circuit 1030 essentially is a combination of voltage leveling circuits 830 and 930 (FIGS. 8, 9), and the various details and embodiments discussed in conjunction with those circuits apply equally to voltage leveling circuit 1030. By way of summary, multi-gate FET 1030 includes a source terminal 1070 (e.g., source terminal 670, FIGS. 6, 7), a drain terminal 1080 (e.g., drain terminal 680, FIGS. 6, 7), a multi-gate FET channel 1090 (e.g., channel 790, FIG. 7) between the source and drain terminals 1070, 1080, and a multi-gate assembly 1060 (e.g., assembly 660, FIG. 6) with a plurality of gate structures 1061, 1062, 1063 (e.g., gate structures 661-663, FIGS. 6, 7) over the multi-gate FET channel 1090.

The multi-gate assembly 1060 is electrically coupled to a gate terminal 1010 (e.g., any of terminals 454-457, FIG. 4) through a plurality of resistances 1012. The source terminal 1070 is electrically coupled to a first node 1014 (e.g., directly or indirectly coupled to any of nodes 428, 448, 438, FIG. 4, or to the drain terminal of another FET), and the drain terminal 1080 is electrically coupled to a second node 1016 (e.g., directly or indirectly coupled to any of nodes 438, 448, 452, 453, FIG. 4 or to the source terminal of another FET).

The voltage leveling circuit 1030 is electrically connected between the source terminal 1070, the drain terminal 1080, and the multi-gate assembly 1060. Circuit 1030 includes a plurality of channel contacts 1032, 1033 (e.g., channel contacts 650 and 651, FIGS. 6, 7), and a plurality of capacitors 1034, 1036, 1037, 1038, according to an embodiment.

Through various electrical connections (e.g., integrated electrical connections 690-693, FIG. 6), the channel contacts 1032, 1033 are electrically coupled to capacitors 1034, 1036-1038, and capacitors 1034, 1036-1038 are electrically coupled to the multi-gate assembly 1060, and to the source and drain terminals 1070, 1080, as discussed previously in conjunction with the description of FIGS. 8 and 9.

Figure 11:
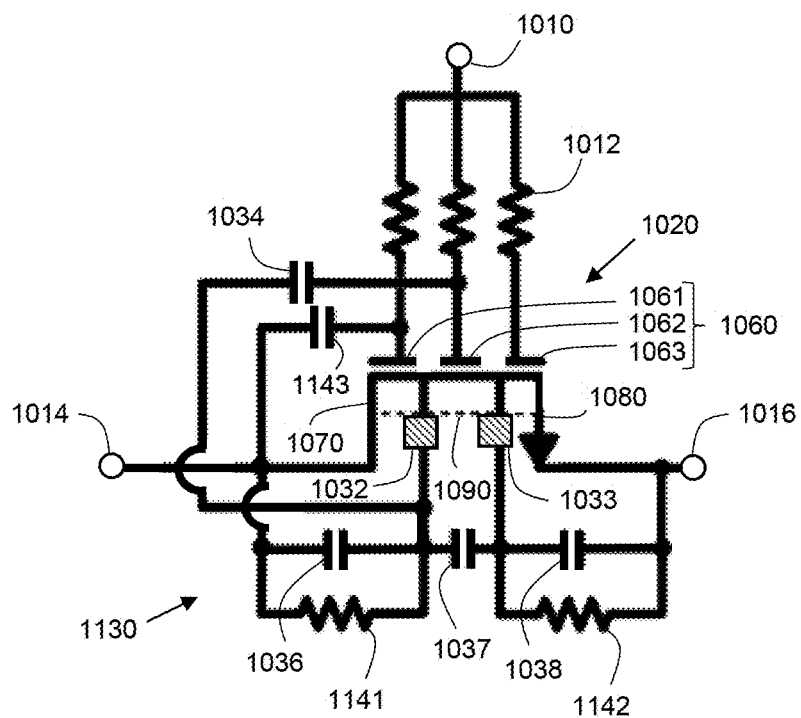
FIG. 11 is a simplified circuit diagram of a voltage leveling circuit electrically coupled to a multi-gate FET, in accordance with yet another embodiment.

FIG. 11 is a simplified circuit diagram of a voltage leveling circuit 1130 (e.g., an instance of one of circuit 571-582, FIGS. 5, 6) electrically coupled to a multi-gate FET 1020 (e.g., any one of FETs 421-423, 425-427, 431-433, 435-437, 521-523, 525-527, 531-533, 535-537, FIGS. 4-6), in accordance with yet another embodiment. Voltage leveling circuit 1130 includes all components of the voltage leveling circuit 1030 of FIG. 10, and the various details and embodiments discussed in conjunction with that circuit applies equally to voltage leveling circuit 1130. Like reference numbers are used in FIGS. 10 and 11 to indicate substantially equivalent components, and for the purpose of brevity, those components are not discussed in detail. In addition to including the components of voltage leveling circuit 1030 (FIG. 10), voltage leveling circuit 1130 also includes additional components 1141-1143, which will be discussed in more detail below.

By way of summary, multi-gate FET 1030 includes a source terminal 1070 (e.g., source terminal 670, FIGS. 6, 7), a drain terminal 1080 (e.g., drain terminal 680, FIGS. 6, 7), a multi-gate FET channel 1090 (e.g., channel 790, FIG. 7) between the source and drain terminals 1070, 1080, and a multi-gate assembly 1060 (e.g., assembly 660, FIG. 6) with a plurality of gate structures 1061, 1062, 1063 (e.g., gate structures 661-663, FIGS. 6, 7) over the multi-gate FET channel 1090.

The multi-gate assembly 1060 is electrically coupled to a gate terminal 1010 (e.g., any of terminals 454-457, FIG. 4) through a plurality of resistances 1012. The source terminal 1070 is electrically coupled to a first node 1014 (e.g., directly or indirectly coupled to any of nodes 428, 448, 438, FIG. 4, or to the drain terminal of another FET), and the drain terminal 1080 is electrically coupled to a second node 1016 (e.g., directly or indirectly coupled to any of nodes 438, 448, 452, 453, FIG. 4 or to the source terminal of another FET).

The voltage leveling circuit 1130 is electrically connected between the source terminal 1070, the drain terminal 1080, and the multi-gate assembly 1060. Circuit 1130 includes a plurality of channel contacts 1032, 1033 (e.g., channel contacts 650 and 651, FIGS. 6, 7), and a plurality of previously-described capacitors 1034, 1036, 1037, 1038, according to an embodiment.

Through various electrical connections (e.g., integrated electrical connections 690-693, FIG. 6), the channel contacts 1032, 1033 are electrically coupled to capacitors 1034, 1036-1038, and capacitors 1034, 1036-1038 are electrically coupled to the multi-gate assembly 1060, and to the source and drain terminals 1070, 1080, as discussed previously in conjunction with the description of FIGS. 8 and 9.

Circuit 1130 also includes an additional capacitor 1143 (e.g., a MIM capacitor or a discrete capacitor). Through various electrical connections (e.g., integrated electrical connection 692, FIG. 6), the source terminal 1070 is electrically coupled to a first terminal (or electrode or plate) of capacitor 1143, and a second terminal (or electrode or plate) of capacitor 1143 is electrically coupled to the multi-gate assembly 1060 through additional electrical connections (e.g., integrated electrical connection 694, FIG. 6). In the embodiment illustrated in FIG. 11, the second terminal of capacitor 1143 is electrically coupled to an outer gate structure 1061. In other embodiments, the second terminal of capacitor 1143 may be electrically coupled to another one of the gate structures 1062 or 1063, or to a plurality of the gate structures 1061-1063. For example, capacitor 1143 has a capacitance value in a range of about 0.05 pF to about 5.0 pF, in an embodiment. In other embodiments, capacitor 834 may have a lower or higher capacitance value than the above-given range.

Circuit 1130 also includes relatively high-value resistors 1141, 1142, which are electrically connected in parallel with capacitors 1036 and 1038, respectively, in an embodiment. Resistors 1141, 1142 may be integrally formed with the semiconductor substrate (e.g., stripline resistors, polysilicon resistors, and so on), or may be discrete resistors that are coupled to the top surface of the substrate, in various embodiments. For example, each of resistors 1141, 1142 has a resistance value in a range of about 2 kiloohms to about 60 kiloohms, in an embodiment. In other embodiments, resistors 1141, 1142 may have a lower or higher resistance value than the above-given range. When implemented in a system with a stack of multi-gate FETs, the resistors 1141, 1142 of the voltage leveling circuit 1130 may result in a more uniform, off-state DC voltage distribution across the FETs of the stack. More specifically, the relatively high-value resistors 1141, 1142 act as conductors for the direct current (DC) signal, which is blocked by the capacitances, both intentional and parasitic, while most of the RF signal passes primarily through the capacitances. This balance is achieved by selecting appropriately valued resistors and capacitors in the parallel resistor/capacitor combinations.

Figure 12:
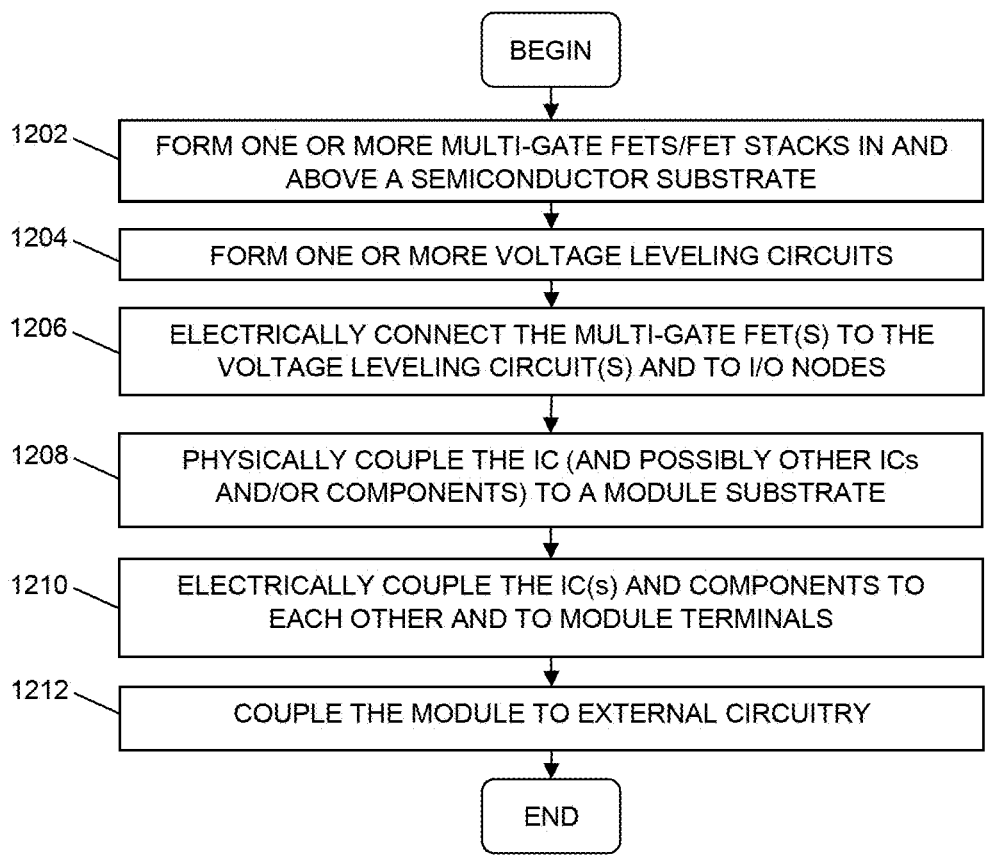
FIG. 12 is a flowchart of a method of fabricating an IC with one or more voltage leveling circuits electrically coupled to one or more multi-gate FETs, in accordance with an embodiment.

FIG. 12 is a flowchart of a method of fabricating an IC (e.g., RF switch IC 500, FIG. 5) with one or more multi-gate FETs (e.g., multi-gate FETs 521-523, 525-527, 531-533, 535-537, FIGS. 5-7) and one or more voltage leveling circuits (e.g., voltage leveling circuits 571-582, 830, 930, 1030, 1130, FIGS. 5, 6, 8-11), in accordance with various embodiments. In a typical IC fabrication process, multiple ICs are fabricated in parallel on a semiconductor wafer, and one of the final fabrication steps includes singulating the individual ICs from the wafer. For simplicity of description, fabrication of a single IC is described below. Those of skill in the art would understand, based on the description herein, that a plurality of ICs may be fabricated simultaneously, as indicated above. Although not specifically pointed out below, when wafer fabrication processes are employed, an IC singulation process may be performed, for example, after block 1204. Similarly, a typical module fabrication process (or IC packaging process) may include simultaneously forming a plurality of modules on a leadframe or PCB, and subsequently singulating each module from the leadframe or PCB. Although also not specifically pointed out below, a module singulation process may be performed, for example, after block 1208.

To facilitate understanding, the below-described method will make reference to fabricating RF switch IC 500 (FIGS. 5-7) with one or more voltage leveling circuits (FIGS. 5, 6, 8-11). However, those of skill in the art would understand, based on the description herein, that the fabrication embodiments alternatively may be used to fabricate differently configured RF switch ICs or other types of devices altogether. Accordingly, reference to the above-described RF switch IC embodiments should not be construed to limit the scope of the inventive subject matter only to those embodiments.

The method may begin, in block 1202, by forming one or more multi-gate FETs (e.g., multi-gate FETs 521-523, 525-527, 531-533, 535-537, FIG. 5) in and above a semiconductor substrate (e.g., substrate 510, FIG. 5). In some embodiments, multiple multi-gate FETs may be formed and electrically interconnected as multi-gate FET stacks (e.g., FET stacks 520, 524, 530, 534, FIG. 5). Generally, each multi-gate FET includes a multi-gate assembly (e.g., multi-gate assembly 660, FIG. 6) and first and second current carrying terminals (e.g., source and drain terminals 670, 680, FIG. 6).

As discussed above, the semiconductor substrate may include any of a variety of different semiconductor substrate materials (e.g., GaAs, GaN, GaN on Si, GaN on SiC, Si, SoI CMOS, bulk Si CMOS, and so on), and the multi-gate FET(s) may have any of a variety of different structures (e.g., pHEMT, MOSFET, HEMT, MESFET, LDMOS FET, EMOSFET, JFET, and so on). According to an embodiment, prior to forming the multi-gate FET(s), conductive through substrate vias (TSVs) may be formed partially or entirely through the substrate to provide for electrical conductivity between the top and bottom surfaces of the substrate (e.g., between a current conducting terminal of one or more of the multi-gate FETs and a ground reference node at the bottom of the substrate).

In block 1204, the method may continue by forming one or more voltage leveling circuits (e.g., voltage leveling circuits 571-582, 830, 930, 1030, 1130, FIGS. 5, 8-10) above the semiconductor substrate. As discussed previously, in various embodiments, the voltage leveling circuits include one or more channel contacts, one or more passive components (e.g., capacitors, resistors, and/or inductors), and various electrical connections between the channel contact(s), the passive component(s), and the multi-gate FET(s). The passive component(s) may be integrally-formed passive components (e.g., integrally formed capacitors, resistors, and/or inductors), and/or discrete components (e.g., discrete capacitors, resistors, and/or inductors), in various embodiments.

In block 1206, the method may continue by electrically coupling the terminals of multi-gate FET(s) to the voltage leveling circuit(s) and to various I/O nodes (e.g., I/O nodes 528, 538, 548, 560, 562, FIG. 5). For example, the electrical connections between the multi-gate FETs and the voltage leveling circuit(s) may include integrated electrical connections (e.g., electrical connections 690-694, FIG. 6). Ultimately, during operation, electrical signals may be received through the I/O nodes from external circuitry, and so electrical signals processed through the multi-gate FET(s) may be provided through the I/O nodes to external circuitry. For example, as discussed previously, the I/O nodes may include a transmitter input node (e.g., transmitter node 528, FIG. 5), a receiver output node (e.g., receiver node 538, FIG. 5), an antenna I/O node (e.g., antenna node 548, FIG. 5), and voltage reference nodes (e.g., reference nodes 552, 553, FIG. 5).

In block 1208, the IC (e.g., RF switch IC 500) is physically coupled to a module substrate (e.g., to module substrate 202, FIG. 2). In addition, one or more additional ICs and/or components (e.g., ICs 232, 234, 250, FIG. 2) also may be physically coupled to the module substrate.

In block 1210, the IC(s) and components are electrically coupled to each other, and to terminals that are configured to convey signals, power, and ground references between external circuitry and the IC(s)/components of the module. The module substrate configuration, the method of coupling the IC(s) and components to the module's terminals, and the number of ICs within the module defines the module or package type. The module may then be completed (e.g., by encapsulating the module or containing the module in an air cavity package). Once the module is completed, it may be physically and electrically coupled to external circuitry (e.g., other portions of system 100, FIG. 1), in block 1212.

Each of the above-described voltage leveling circuits includes one or more capacitors and one or more channel contacts, which are electrically coupled to a channel of a multi-gate FET. The one or more capacitors of the voltage leveling circuit is/are electrically connected between the channel contact(s) and a multi-gate structure, a source terminal, and/or a drain terminal of the multi-gate FET. Some voltage leveling circuit embodiments also include resistors (e.g., resistors 1141, 1142, FIG. 11). Although the previously-described embodiments of voltage leveling circuits include capacitors and (in some cases) resistors, other embodiments may include other types of passive components, as well (e.g., integrated or discrete inductances). Essentially, the voltage leveling circuit embodiments include at least one channel contact and a passive component circuit with one or more passive components, where the passive component circuit is configured to achieve more uniform off-state, AC voltage distribution across a stack of multi-gate FETs, when compared with conventional multi-gate FET stack structures.

An embodiment of a field effect transistor (FET) circuit includes source and drain terminals coupled to an active surface of a semiconductor substrate, a channel in the substrate between the source and drain terminals, and a plurality of gate structures coupled to the active surface over the channel. A channel contact is coupled to the active surface over the channel between a pair of the gate structures. A first capacitor is electrically coupled between the channel contact and the source terminal, and a second capacitor is electrically coupled between the channel contact and the drain terminal.

An embodiment of a radio frequency switch includes an antenna node, a first transmit/receive (T/R) node, and a FET between the antenna node and the first T/R node. The first FET includes a semiconductor substrate with an active surface, a source terminal coupled to the active surface, a drain terminal coupled to the active surface, a channel in the semiconductor substrate between the source and drain terminals, and a plurality of gate structures coupled to the active surface over the channel. The radio frequency switch also includes a channel contact coupled to the active surface over the channel between a pair of the gate structures. A first capacitor is electrically coupled between the channel contact and the source terminal, and a second capacitor is electrically coupled between the channel contact and the drain terminal.

An embodiment of a method of fabricating a FET circuit includes forming a FET in and over an active surface of a semiconductor substrate by coupling a source terminal to the active surface, coupling a drain terminal to the active surface, where a channel is present in the semiconductor substrate between the source and drain terminals. The method further includes coupling a plurality of gate structures to the active surface over the channel, coupling a channel contact to the active surface over the channel between a pair of the gate structures, electrically coupling a first capacitor between the channel contact and the source terminal, and electrically coupling a second capacitor between the channel contact and the drain terminal.

The foregoing detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the foregoing technical field, background, or detailed description.

For the sake of brevity, conventional semiconductor fabrication techniques may not be described in detail herein. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A field effect transistor (FET) circuit comprising:
a semiconductor substrate with an active surface;
a source terminal coupled to the active surface;
a drain terminal coupled to the active surface;
a multi-gate FET channel in the semiconductor substrate between the source and drain terminals;
a plurality of gate structures coupled to the active surface over the multi-gate FET channel;
a first channel contact coupled to the active surface over the multi-gate FET channel between a first pair of gate structures of the plurality of gate structures;
a first capacitor electrically coupled between the first channel contact and the source terminal; and
a second capacitor electrically coupled between the first channel contact and the drain terminal.

2. The FET circuit of claim 1, wherein the first and second capacitors each have a capacitance value in a range of 0.05 picofarads to 5.0 picofarads.

3. The FET circuit of claim 1, further comprising:
a second channel contact coupled to the active surface between a second pair of the gate structures; and
a third capacitor electrically coupled between the first and second channel contacts.

4. The FET circuit of claim 1, further comprising:
a third capacitor electrically coupled between the first channel contact and a gate structure of the plurality of gate structures.

5. The FET circuit of claim 1, further comprising:
a first resistor coupled between the first channel contact and the source terminal in parallel with the first capacitor; and
a second resistor coupled between the first channel contact and the drain terminal in parallel with the second capacitor.

6. The FET circuit of claim 5, further comprising:
a second channel contact coupled to the active surface between a second pair of the gate structures; and
a third capacitor electrically coupled between the first and second channel contacts.

7. The FET circuit of claim 5, wherein the first and second resistors are stripline resistors that are integrally formed with the semiconductor substrate over the active surface.

8. The FET circuit of claim 5, wherein the first and second resistors each have a resistance value in a range of 2 kiloohms to 60 kiloohms.

9. The FET circuit of claim 1, further comprising:
a third capacitor electrically coupled between the source terminal and a second gate structure of the plurality of gate structures, where the second gate structure may be the same as or different from the first gate structure.

10. The FET circuit of claim 1, wherein the first channel contact is an ohmic contact.

11. The FET circuit of claim 1, wherein the first and second capacitors each are a metal-insulator-metal capacitor that is integrally formed with the semiconductor substrate over the active surface.

12. The FET circuit of claim 1, wherein the semiconductor substrate is selected from a group that includes a gallium arsenide substrate, a silicon substrate, a silicon-on-insulator CMOS substrate, a bulk silicon CMOS substrate, a gallium nitride substrate, a gallium nitride-on-silicon substrate, and a gallium nitride on silicon carbide substrate.

13. A radio frequency switch comprising:
- an antenna node;
- a first transmit/receive (T/R) node;
- a first field effect transistor (FET) between the antenna node and the first T/R node, wherein the first FET includes
  - a semiconductor substrate with an active surface,
  - a source terminal coupled to the active surface,
  - a drain terminal coupled to the active surface,
  - a multi-gate FET channel in the semiconductor substrate between the source and drain terminals, and
  - a plurality of gate structures coupled to the active surface over the multi-gate FET channel;
- a first channel contact coupled to the active surface over the multi-gate FET channel between a first pair of gate structures of the plurality of gate structures;
- a first capacitor electrically coupled between the first channel contact and the source terminal; and
- a second capacitor electrically coupled between the first channel contact and the drain terminal.

14. The radio frequency switch of claim 13, further comprising:
- a second channel contact coupled to the active surface between a second pair of the gate structures; and
- a third capacitor electrically coupled between the first and second channel contacts.

15. The radio frequency switch of claim 13, further comprising:
- a third capacitor electrically coupled between the first channel contact and a gate structure of the plurality of gate structures.

16. The radio frequency switch of claim 13, further comprising:
- at least one additional FET coupled in series with the first FET between the antenna node and the first T/R node.

17. The radio frequency switch of claim 13, further comprising:
- a second FET coupled between the first T/R node and a voltage reference terminal.

18. The radio frequency switch of claim 17, further comprising:
- at least one additional FET coupled in series with the second FET between the first T/R node and the voltage reference terminal.

19. The radio frequency switch of claim 13, further comprising:
- a second T/R node; and
- a second FET between the antenna node and the second T/R node.

20. The radio frequency switch of claim 19, further comprising:
- a third FET coupled between the first T/R node and a voltage reference terminal; and
- a fourth FET coupled between the second T/R node and the voltage reference terminal.

* * * * *